United States Patent
Riggio et al.

(10) Patent No.: US 10,454,464 B2
(45) Date of Patent: Oct. 22, 2019

(54) SOLID-STATE POWER CONTROL METHOD AND APPARATUS

(71) Applicant: PowerBloks, LLC, Greeley, CO (US)

(72) Inventors: Christopher A Riggio, Greeley, CO (US); Ammon N Balaster, Boulder, CO (US)

(73) Assignee: POWERBLOKS, LLC

( * ) Notice: Subject to any disclaimer, the term of this patent is extended or adjusted under 35 U.S.C. 154(b) by 0 days.

(21) Appl. No.: 15/929,082

(22) Filed: Jan. 3, 2019

(65) Prior Publication Data

US 2019/0207597 A1    Jul. 4, 2019

Related U.S. Application Data

(60) Provisional application No. 62/613,349, filed on Jan. 3, 2018.

(51) Int. Cl.
     *H03K 3/00*      (2006.01)
     *H03K 7/08*      (2006.01)
     *H03K 17/687*      (2006.01)

(52) U.S. Cl.
     CPC ............. *H03K 7/08* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 2013/0063186 A1* | 3/2013 | DeBeer | H03K 17/164 327/109 |
| 2017/0277585 A1* | 9/2017 | Nakajima | G06F 11/079 |
| 2018/0083443 A1* | 3/2018 | Mertens | H02H 9/046 |
| 2019/0173454 A1* | 6/2019 | Jun | H03K 3/013 |

\* cited by examiner

*Primary Examiner* — Lincoln D Donovan
*Assistant Examiner* — Khareem E Almo
(74) *Attorney, Agent, or Firm* — Oppedahl Patent Law Firm LLC; Aileen Law

(57) ABSTRACT

With the disclosed device, a control method is set forth to control the flow of power between an electrical source and an electrical load.

11 Claims, 4 Drawing Sheets

SOLID-STATE POWER CONTROL METHOD AND APPARATUS

FIELD OF ART

The disclosed device relates generally to electronic power control, and more specifically to a fluid, dynamic, multi-spectral modulation means and method to enable fixed or variable control between a source and a load.

BACKGROUND

It is well-known that an electromechanical relay (EMR) uses a physical moving part to connect contacts within the output component of the relay. The movement of this contact is generated using electromagnetic forces from the low-power input signal, allowing the completion of the circuit that contains the high-power signal. EMR typically use solenoids, coils, magnetic fields, springs and mechanical contacts to operate and switch a supply.

A solid-state relay (SSR) uses a low power electrical signal to generate an optical semiconductor signal, typically with an octo-coupler, that transmits and energizes the output signal. When activated, the input optical signal acts as the drive path to power a "switch" that allows a high voltage and or current signal to pass through the SSR's output component. Unlike EMR, the SSR lacks moving parts, hence the device is solid-state.

To date, there are no non-electromechanical product offerings available in the searchable market literature which address the need for an adjustable, high-current, solid-state solution (e.g., relay, contactor). Current options are limited and even those that may be available are non-adjustable (non-variable control). Further, solid state relays with very high current ratings (e.g., greater than 150 A) are still very expensive to buy due to their power semiconductor and heat sinking requirements, and as such, cheaper electromechanical contactors are frequently still used.

Conventional power control methods such as pulse-width modulation (PWM), pulse-frequency modulation (PFM), or various combinations of such modulation, are typically implemented with a dedicated power control integrated circuit (IC) which can involve size, cost, and circuit complexities and the associated consequences.

Not only can the disclosed device provide for the elimination of a dedicated modulation IC and associated circuitry, it provides improvements in size, cost, performance, complexity and can be used for a vast host of applications.

SUMMARY OF THE DISCLOSURE

The disclosed device provides for a simplified fixed control (mode 1) or variable control (mode 2) of power between an electrical source and an electrical load.

The disclosed device provides for the integration of a single conductor for user command and circuit power.

The disclosed device provides for the elimination of a dedicated modulation IC and associated circuitry as is found in the existing art.

The disclosed device provides for adaptive dither modulation (ADM) behavior that can be produced by making small voltage-level changes based on any desired control criteria.

The disclosed device provides for an avoidance of a mid-state, slow rise and fall time, drive input to any semiconductor chosen for power control.

The disclosed device provides for stable operation regardless of noise in the user command and power line.

The disclosed device provides for an adjustable current, non-mechanical solid-state contactor useful where a user-adjustable current path is required.

These and other aspects of the disclosed device and methodology will appear from the description and/or appended claims, reference being made to the accompanying drawings that form a part of this specification wherein like reference characters designate corresponding parts in the several views.

Before explaining the disclosed embodiments of the disclosed device, it is to be understood that the device is not limited in its application to the details of the particular arrangements shown, since the device is capable of other embodiments. Also, the terminology used herein is for the purpose of description and not of limitation.

DESCRIPTION OF THE DISCLOSED EMBODIMENTS

Figure 1:
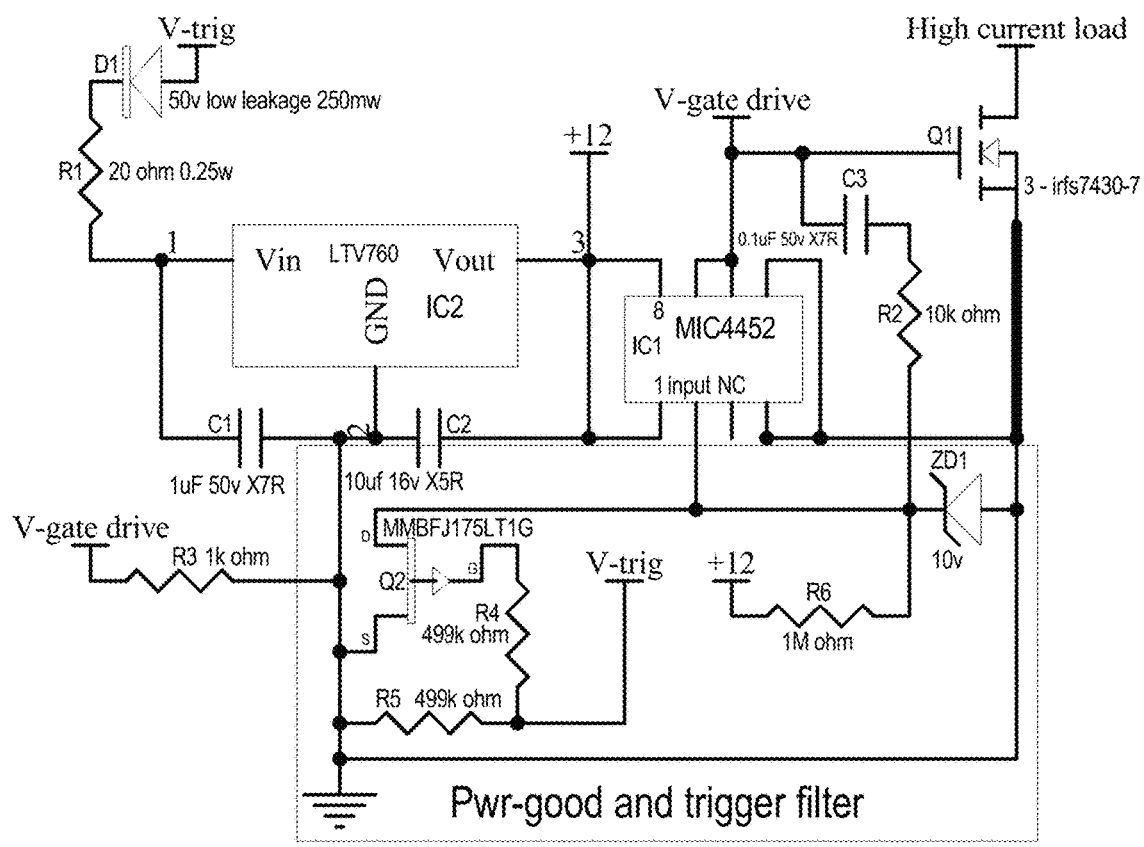
FIG. 1 is an electrical diagram illustrating a 250-amp, single-wire, non-mid-state driven, solid-state contactor (fixed control or mode 1).

The disclosed circuit shown in FIG. 1 operates in mode 1 (fixed control) and provides a noise-immune, non-mid-state, single-conductor, user-selectable drive to Q1 when V-trig is high. As is further described below, V-trig is designed to provide two functions—to provide circuit power as well as a command voltage. Drive IC1 issues a fast rise-time, high step-current, source-or-sink output state to Q1 upon the high, e.g., 15 to 30 vdc, or low, e.g., 0 vdc, application of the small, user-controlled, current input at V-trig. The V-trig line supplies circuit power through diode D1 and R1 to the C1-coupled input pin of voltage regulator IC2, inducing the C2-coupled output of regulator IC2. The output of regulator IC2 powers the IC1 drive and associated circuitry. V-trig also provides the command voltage to control the output state of drive IC1. When V-trig is low, the regulator IC2 input and transistor Q2 gate input is low. Ground-connected R3 holds drive IC1 output low until drive IC1 is powered. Zero voltage on the gate-pin of transistor Q2 clamps drive IC1 pin-2 low. When drive IC1 is powered, output low is internally clamped while pin-2 of drive IC1 is low.

When V-trig is high, voltage appears at the gate-pin of transistor Q2 from the divided output at R4 and R5 which turns off the drain-source path of transistor Q2, releasing the input clamp on pin-2 of drive IC1. The plus 12 vdc output of regulator IC2 connected through R6, ramps pin-2 of drive IC1 up to the output-high threshold voltage of drive IC1. The charging time of C3 through R2 and R6 determines the positive-voltage slope at pin-2 of drive IC1 and hence the Ton delay of drive IC1. When the IC1 drive output for Q1 goes high, a fast-rise, positive current is injected through R2 and C3 into the junction of Zener diode ZD1 and pin-2 of drive IC1. When V-trig is low, the Toff of drive IC1 is more immediate than the positive voltage slope since the gate-pin of transistor Q2 follows V-trig when low which clamps pin-2 of drive IC1 to ground, inducing the active-low clamping of the IC1 drive output prior to the depletion of C2. The action of each output transition at drive IC1 resets C3 to cause rapid injections of Ton or Toff current that latch a high or low input state for pin-2 of drive IC1 to prevent any mid-state instability issues in IC1 and damage to power semi-conductor Q1. Thus, the disclosed device provides stability which enables a non-mid-state environment to exist as well as noise filtering and eliminating the need for a dedicated modulation IC and associated circuitry.

Figure 1A:
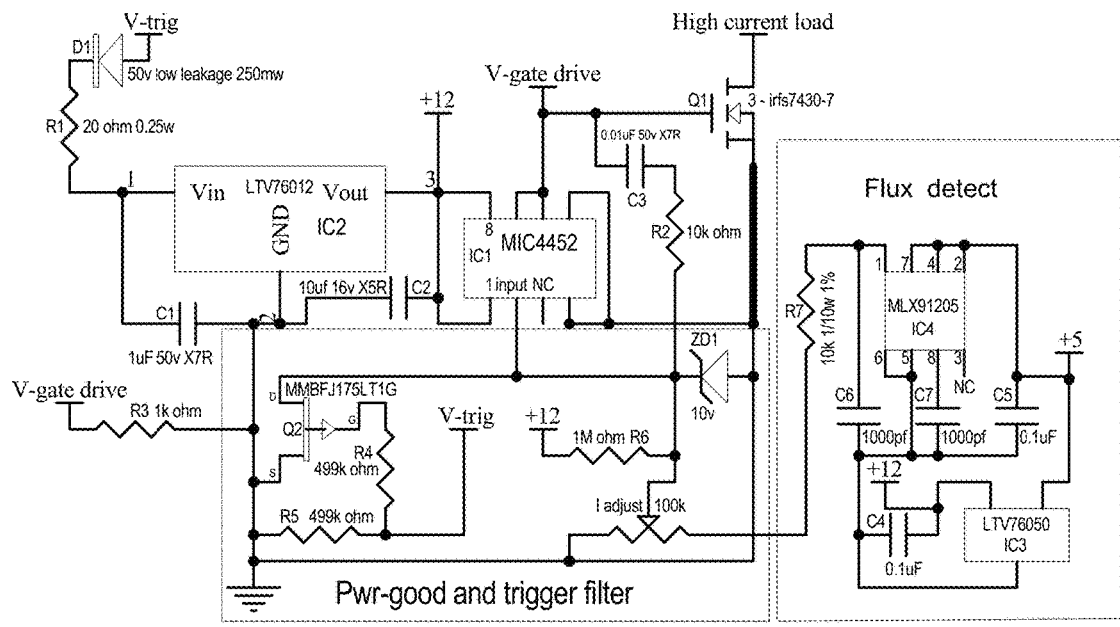
FIG. 1a is an electrical diagram illustrating a 250-amp, single-wire, non-mid-state driven, direct flux-controlled feedback, current-adjustable, solid-state contactor operating in ADM mode (mode 2).

The disclosed circuit shown in FIG. 1a operates in two modes from basic component-value programming: mode 1, as a single-wire, non-mid-state, on-off controller, and mode 2, as a non-mid-state controller as well as a feedback-directed ADM controller. The default operating mode is mode 1 until a feedback condition induces mode 2. In each mode, the V-trig line supplies circuit power through diode D1 and R1 to the C1-coupled input pin of voltage regulator IC2, inducing the C2-coupled output of regulator IC2. The output of regulator IC2 powers the IC1 drive, the C4-coupled input of voltage regulator IC3, and associated circuitry. The C5-coupled output of regulator amplifier IC3 powers the supply input of flux amplifier IC4. V-trig also provides the command voltage to control the output state of drive IC1 for modes 1 and 2. When V-trig is low, the regulator IC2 input and transistor Q2 gate input is low. Ground-connected R3 holds drive IC1 output low until drive IC1 is powered. Zero voltage on the gate-pin of transistor Q2 clamps drive IC1 pin-2 low. When drive IC1 is powered, output low is internally clamped while pin-2 of drive IC1 is low.

When V-trig is high, voltage appears at the gate-pin of transistor Q2 from the divided output at R4 and R5 which turns off the drain-source path of transistor Q2, releasing the input clamp on pin-2 of drive IC1. The plus 12 vdc output of regulator IC2 connected through R6, ramps pin-2 of drive IC1 up to the output-high threshold voltage of drive IC1. The charging time of C3 through R2 and R6 determines the positive-voltage slope at pin-2 of drive IC1 and hence the Ton delay of drive IC1. When the IC1 drive output for Q1 goes high, a fast-rise, positive current is injected through R2 and C3 into the junction of Zener diode ZD1 and pin-2 of drive IC1. When V-trig is low, the Toff of drive IC1 is more immediate than the positive voltage slope since the gate-pin of transistor Q2 follows V-trig when low which clamps pin-2 of drive IC1 to ground, inducing the active-low clamping of the IC1 drive output prior to the depletion of C2. The action of each output transition at drive IC1 resets C3 to cause rapid injections of Ton or Toff current that latch a high or low input state for pin-2 of drive IC1 to 3o prevent any mid-state instability issues in drive IC1 and damage to power semi-conductor Q1.

The operating mode is selected by changing the value of C3 for slower (mode 1) or faster (mode 2) response. For mode-2 (ADM operation), a 0 to 5 vdc level from C6-coupled pin-1 of flux amplifier IC4 is summed into the junction at pin-2 of drive IC1 where R7 and R-I-adjust (e.g., a potentiometer), induce ADM-regulation behavior to maintain a user-selectable load current. The disclosed device results in ADM behavior that can be produced by making small voltage-level changes based on the desired control criteria.

Figure 1B:
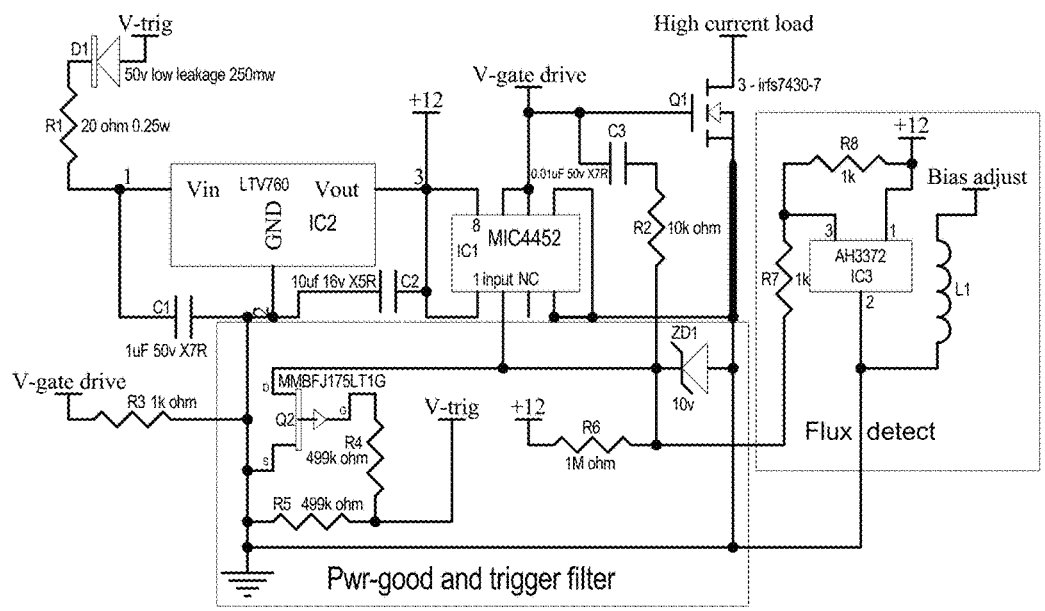
FIG. 1b is an electrical diagram illustrating a 250-amp, single-wire, non-mid-state driven, bias flux-controlled-feedback, current-adjustable, solid-state contactor operating in ADM mode (mode 2).

The disclosed circuit shown in FIG. 1b operates in two modes from basic component-value programming: mode 1, as a single-wire, non-mid-state, on-off controller, and mode 2, as a non-mid-state controller as well as a feedback-directed ADM controller. The default operating mode is mode 1 until a feedback condition induces mode 2. In each mode, the V-trig line supplies circuit power through diode D1 and R1 to the C1-coupled input pin of voltage regulator IC2, inducing the C2-coupled output of regulator IC2. The output of regulator IC2 powers the IC1 drive, the R8-coupled pull-up of flux amplifier IC3, and associated circuitry. V-trig also provides the command voltage to control the output state of drive IC1 for modes 1 and 2. When V-trig is low, the regulator IC2 input and transistor Q2 gate input is low. Ground-connected R3 holds drive IC1 output low until drive IC1 is powered. Zero voltage on the gate-pin of transistor Q2 clamps drive IC1 pin-2 low. When drive IC1 is powered, output low is internally clamped while pin-2 of drive IC1 is low.

When V-trig is high, voltage appears at the gate-pin of transistor Q2 from the divided output at R4 and R5 which turns off the drain-source path of transistor Q2, releasing the input clamp on pin-2 of drive IC1. The plus 12 vdc output of regulator IC2 connected through R6, ramps pin-2 of drive IC1 up to the output-high threshold voltage of drive IC1. The charging time of C3 through R2 and R6 determines the positive-voltage slope at pin-2 of IC1 and hence the Ton delay of drive IC1. When the IC1 drive output for Q1 goes high, a fast-rise, positive current is injected through R2 and C3 into the junction of Zener diode ZD1 and pin-2 of drive IC1. When V-trig is low, the Toff of drive IC1 is more immediate than the positive voltage slope since the gate-pin of transistor Q2 follows V-trig when low which clamps pin-2 of drive IC1 to ground, inducing the active-low clamping of the IC1 drive output prior to the depletion of C2. The action of each output transition at drive IC1 resets C3 to cause rapid injections of Ton or Toff current that latch a high or low input state for pin-2 of drive IC1 to prevent any mid-state instability issues in drive IC1 and damage to power semi-conductor Q1.

The operating mode is selected by changing the value of C3 for slower (mode 1) or faster (mode 2) response. For mode-2 ADM operation, a 0 to 5 vdc level from IC3 is summed through R7 into the junction at pin-2 of drive IC1. Flux amplifier IC3 receives power through R8 from the output of regulator IC2. Flux amplifier IC3 is a high-sensitivity, fixed-output flux amplifier whose output is held high by R8, and remains so until pin-3 of flux amplifier IC3 goes low in response to the flux induced by the Q1 load current. The flux amplifier IC3 pin-3 output high or low threshold flux is altered by a user-controlled inductor (e.g., an electromagnet) L1-bias current. Inductor L1 produces a counter flux resulting in flux-proportional voltage level changes at pin-3 of flux amplifier IC3 through R7 to pin-2 of drive IC1. User-adjustable load current is thereby achieved.

Figure 2:
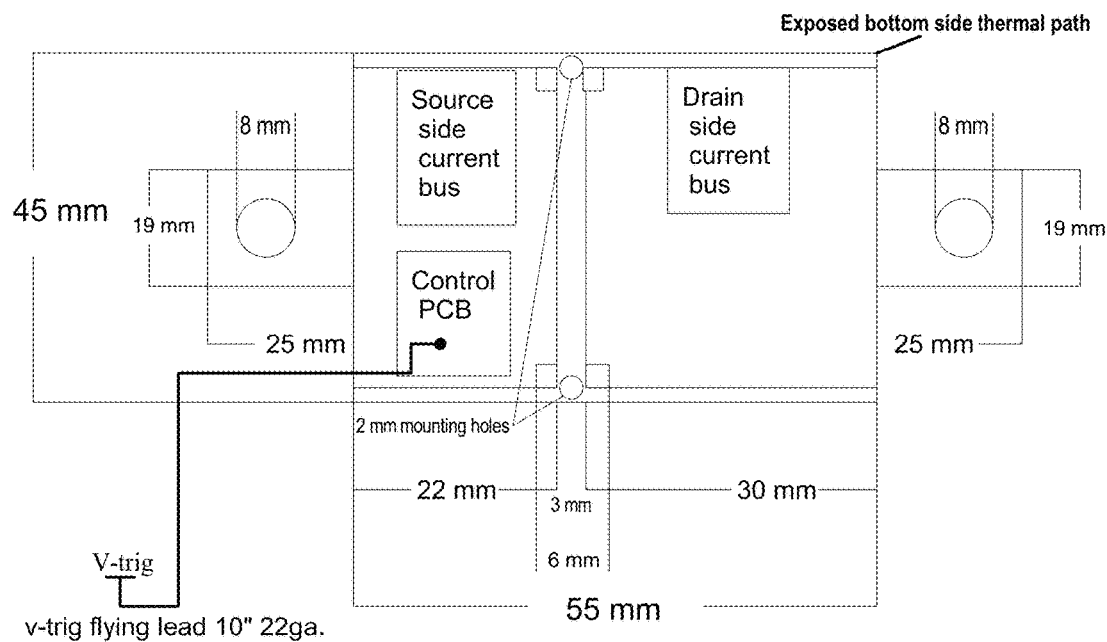
FIG. 2 is a 2-dimensional mechanical diagram illustrating one embodiment of a 250-amp, single-wire, potted or molded solid-state contactor module form factor.

FIG. 2 illustrates a 250-amp, single-wire, potted or molded solid-state contactor module form factor. The embodiment shown comprises an enclosure having rigid mounting points, electrical connection areas, and thermal-management surfaces for the application of FIGS. 1, 1a, and 1b. The module thickness, not shown in FIG. 2, can vary but is not limited to about 10 mm to about 35 mm depending on the application. The disclosed device provides for a compact solid-state solution with simplified circuitry and improved performance.

The disclosed device is a modulation-based control method applicable to any power control application. With the disclosed device, no discreet modulation generator or component is required. Further, the disclosed device provides for a single conductor input for powering, commanding, filtering, and controlling a fixed or variable high-current, power semiconductor path between a source and a load. The power semiconductor may be single or multiple normally on or off, N or P-channel power semiconductors. The control circuit disclosed herein provides a fast rise and fall time, non-mid-state drive environment to a power-semiconductor in either of two modes 1) fixed on/off, or 2) adjustable variable analog feed-back controlled conduction. The modulation-based controller offers a fluid, dynamic, multi-spectral modulation that enables user controlled, regulated conduction of said power semiconductor in said mode two operation. It is adaptive and can be used to control a variety of applications that require control or modulation. It is contemplated that the single conductor system disclosed herein could be used to control non-electronic conditions such as pressure, for example.

Although the disclosed device and method have been described with reference to disclosed embodiments, numerous modifications and variations can be made and still the result will come within the scope of the disclosure. No limitation with respect to the specific embodiments disclosed herein is intended or should be inferred.

We claim:

1. An electronic power control system comprising:
   a single conductor for supplying circuit power, said conductor also providing a command voltage, said conductor coupled to a diode, a resistive element and a voltage regulator which, in the presence of an input current from said conductor, induces an output to power a drive, said drive capable of issuing a non-mid-state, fast rise and fall time voltage output to a power semiconductor; and
   wherein user supplied input voltage allows a transistor to release the input of the drive, thereby allowing for filtered voltage change at the input from a low state to a threshold state, at which time fast rise-time voltage is delivered to said power semiconductor and to series-coupled capacitive and resistive elements which feed back to the input to lock the input above a threshold voltage.

2. The system of claim 1 further comprising a clamping of the drive output by the feedback supplied input voltage when a low voltage threshold state is reached.

3. The system of claim 1 further comprising small filtered voltage-level changes applied to the input of said drive to induce adaptive dither modulation (ADM)—regulation behavior to maintain a user-selectable criteria.

4. The system of claim 1 further comprising small filtered voltage-level changes applied to the input of said drive to induce ADM-regulation behavior to maintain a user-selectable load current.

5. The system of claim 1, wherein said power semiconductor may be single or multiple, normally on or off, N- or P-channel.

6. The system of claim 1, wherein said conductor comprises a V-trig line.

7. A controller comprising:
   a single conductor for supplying circuit power, said conductor also providing a command voltage, said conductor coupled to a diode, a resistive element and a voltage regulator which, in the presence of an input current from said conductor, induces an output to power a drive, said drive capable of issuing a non-mid-state, fast rise and fall time voltage output to a power semiconductor;
   wherein user supplied input voltage allows a transistor to release the input of the drive, thereby allowing for filtered voltage change at the input from a low state to a threshold state, at which time fast rise-time voltage is delivered to said power semiconductor and to series-coupled capacitive and resistive elements which feed back to the input to lock the input above a threshold voltage;
   wherein the feedback supplied input voltage induces clamping of the drive output upon reaching a low voltage threshold state; and
   wherein small filtered voltage-level changes applied to the input of said drive induce adaptive dither modulation (ADM)—regulation behavior to maintain a user-selectable criteria.

8. The controller of claim 7 being adaptive to control a variety of applications that require control or modulation.

9. A method for providing an electronic power control system, the method comprising the steps of:
   providing a single conductor for supplying circuit power, said conductor also providing a command voltage, said conductor coupled to a diode, a resistive element and a voltage regulator which, in the presence of an input current from said conductor, induces an output to power a drive, said drive capable of issuing a non-mid-state, fast rise and fall time voltage output to a power semiconductor; and
   introducing a user supplied input voltage that allows a transistor to release the input of the drive, thereby allowing for filtered voltage change at the input from a low state to a threshold state, at which time fast rise-time voltage is delivered to said power semiconductor and to series-coupled capacitive and resistive elements which feed back to the input to lock the input above a threshold voltage.

10. The method of claim 9 further comprising the step of using the feedback supplied input voltage to clamp the drive output when a low voltage threshold state is reached.

11. The method of claim 9 further comprising the step of applying small filtered voltage-level changes to the input of said drive to induce adaptive dither modulation (ADM)—regulation behavior to maintain a user-selectable criteria.

* * * * *